(12) United States Patent
Kogure

(10) Patent No.: US 8,967,605 B2
(45) Date of Patent: Mar. 3, 2015

(54) CARRIER ASSEMBLY APPARATUS

(75) Inventor: Yoshinari Kogure, Saitama (JP)

(73) Assignee: Advantest Corporation, Tokyo (JP)

( * ) Notice: Subject to any disclaimer, the term of this patent is extended or adjusted under 35 U.S.C. 154(b) by 1115 days.

(21) Appl. No.: 12/966,201

(22) Filed: Dec. 13, 2010

(65) Prior Publication Data

US 2011/0148020 A1    Jun. 23, 2011

(30) Foreign Application Priority Data

Dec. 18, 2009    (JP) ................................. 2009-288192

(51) Int. Cl.
| | | |
|---|---|---|
| B23Q 1/25 | (2006.01) |
| B23Q 1/64 | (2006.01) |
| G01R 1/067 | (2006.01) |
| G01R 31/00 | (2006.01) |
| H05K 3/30 | (2006.01) |
| G01R 1/04 | (2006.01) |

(52) U.S. Cl.
CPC ................................... G01R 1/0408 (2013.01)
USPC ............. 269/56; 269/55; 324/756.02; 29/832

(58) Field of Classification Search
USPC .......... 269/56, 55, 21, 903; 324/755, 757.01, 324/756.01, 756.02, 756.05, 757.02, 324/757.03; 29/832, 833, 739, 741; 361/757, 802, 760; 174/250, 257, 260; 382/141, 145, 146, 151; 384/86, 87, 384/90, 94, 95

See application file for complete search history.

(56) References Cited

U.S. PATENT DOCUMENTS

| | | | | |
|---|---|---|---|---|
| 5,424,652 | A | * | 6/1995 | Hembree et al. .......... 324/756.02 |
| 5,453,701 | A | * | 9/1995 | Jensen et al. ............. 324/750.25 |
| 5,534,785 | A | * | 7/1996 | Yoshizaki et al. ........ 324/756.02 |
| 5,570,032 | A | * | 10/1996 | Atkins et al. ............. 324/750.06 |
| 5,757,199 | A | | 5/1998 | Maruyama |
| 5,828,224 | A | * | 10/1998 | Maruyama ................ 324/756.02 |
| 5,986,459 | A | * | 11/1999 | Fukaya et al. ............ 324/756.02 |
| 6,445,200 | B2 | * | 9/2002 | Haseyama ................ 324/750.09 |
| 6,741,090 | B2 | * | 5/2004 | Yamashita ................ 324/750.08 |
| 6,781,395 | B2 | * | 8/2004 | Maruyama et al. ....... 324/758.01 |

(Continued)

FOREIGN PATENT DOCUMENTS

| | | |
|---|---|---|
| CN | 101013811 | 8/2007 |
| JP | 07263504 | 10/1995 |

(Continued)

OTHER PUBLICATIONS

Taiwan Office action, mail date is Aug. 28, 2013.

(Continued)

*Primary Examiner* — Alvin Grant
(74) *Attorney, Agent, or Firm* — Greenblum & Bernstein, P.L.C.

(57) ABSTRACT

[Problem] A carrier assembly apparatus which is able to be streamlined in structure is provided.
[Solution] The carrier assembly apparatus 1 comprises: an assembly table 31 which supports a base member 70 on which a die 90 is placed, a holding head 46 which holds a cover member 80, a pressure reduction head 44 which has a pressure reduction chamber 443 accommodating the cover member 80 and having an opening part 444 and which abuts against the assembly table 31 so as to form a sealed space, a first elevating actuator 43 which simultaneously move the holding head 46 and the pressure reduction head 44 to the assembly table 31, and a second elevating actuator 47 which moves the holding head 46 relative to the pressure reduction head 44.

10 Claims, 14 Drawing Sheets

(56) References Cited

U.S. PATENT DOCUMENTS

| | | | |
|---|---|---|---|
| 7,709,748 B2 * | 5/2010 | Hsieh et al. | 174/355 |
| 8,101,436 B2 * | 1/2012 | Takekoshi | 438/18 |
| 2002/0196040 A1 * | 12/2002 | Arakawa et al. | 324/755 |
| 2004/0046581 A1 * | 3/2004 | Maekawa et al. | 324/755 |
| 2006/0029762 A1 * | 2/2006 | Chung | 428/40.1 |
| 2007/0252609 A1 * | 11/2007 | Liang et al. | 324/755 |
| 2008/0315899 A1 * | 12/2008 | Groeninger | 324/755 |

FOREIGN PATENT DOCUMENTS

| | | |
|---|---|---|
| JP | 10-068758 | 3/1998 |
| JP | 2003-185702 | 7/2003 |
| JP | 2003-344484 | 12/2003 |
| KR | 1020080013319 | 2/2008 |
| TW | 200537968 | 11/2005 |

OTHER PUBLICATIONS

China Office action, mail date is Mar. 25, 2013.
Japan Office action, dated Jun. 25, 2013 along with an english translation thereof.
Korea Office action, mail date is Sep. 5, 2012.

* cited by examiner

US 8,967,605 B2

CARRIER ASSEMBLY APPARATUS

TECHNICAL FIELD

The present invention relates to a carrier assembly apparatus which assembles a test carrier which is used for testing integrated circuit devices and other electronic circuit devices which are formed into a die.

BACKGROUND ART

As a test carrier on which a semiconductor chip is temporarily mounted in a bare chip state, one which sandwiches the chip between two films is known. The semiconductor chip and two films are carried in a vacuum furnace and aligned, then the pressure inside the vacuum furnace is reduced so as to assemble this test carrier (for example, see PLT 1).

CITATION LIST

Patent Literature

PLT 1: Japanese Patent Publication (A) 7-263504

SUMMARY OF INVENTION

Technical Problem

However, in the above art, a semiconductor chip and two films are carried in the vacuum furnace, the vacuum furnace is sealed and reduced in pressure, then the bottom film on which the semiconductor chip is placed is covered with the top film. For this reason, a conveyance system which carries the top film from the outside to the inside of the vacuum furnace and a conveyance system which handles the top film inside of the vacuum furnace end up being interrupted and therefore there is the problem that the system structure becomes complicated.

The problem which the present invention tries to solve is the provision of a carrier assembly apparatus enabling streamlining of the structure.

Solution to Problem

[1] The carrier assembly apparatus according to the present invention is a carrier assembly apparatus which assembles a test carrier having a base member and a cover member between which an electronic device is sandwiched, the carrier assemble apparatus comprising: an assembly table which supports the base member on which the electronic device is placed; a holding head which holds the cover member; a pressure reduction head which has a pressure reduction chamber accommodating the cover member and having an opening part and which abuts against the assembly table so as to form a sealed space; a first moving means for simultaneously moving the holding head and the pressure reduction head to the assembly table; and a second moving means for moving the holding head relative to the pressure reduction head.

[2] In the above invention, the pressure reduction head may also have: a tubular part which is able to accommodate the cover member; and a lid part which shuts one end of the tubular part.

[3] In the above invention, the second moving means has a shaft which is connected to the holding head, and the shaft passes through the lid part so that the holding head is positioned inside the tubular part.

[4] In the above invention, the assembly table may have suction holes which hold the base member by suction.

[5] In the above invention, the carrier assembly apparatus may comprise: an emitting means for emitting ultraviolet toward a bonding part which bonds the base member and the cover member, while the pressure reduction head may have a window through which ultraviolet which is emitted from the emitting means toward the bonding part passes.

[6] In the above invention, the carrier assembly apparatus may comprise a pressure reducing means which is connected to the pressure reduction chamber and reduces the pressure of the sealed space which is formed by the assembly table and the pressure reduction head.

[7] In the above invention, the carrier assembly apparatus may comprise: a third moving means for moving the base member to the assembly table; and a fourth moving means for placing the electronic device on the base member which is supported on the assembly table.

[8] In the above invention, the carrier assembly apparatus may comprise an interconnect forming means for forming an interconnect pattern on the base member.

[9] In the above invention, at least one of the base member or the cover member may have a film shaped member.

[10] In the above invention, the electronic device may be a die which is formed by dicing a semiconductor wafer.

Advantageous Effects of Invention

In the present invention, it is possible that the first moving means moves the holding head and the pressure reduction head and makes them abut against the assembly table and then the second moving means moves only the holding head and places the cover member on the base member, so the structure of the carrier assembly apparatus can be streamlined.

EMBODIMENTS OF INVENTION

Below, an embodiment of the present invention will be explained on the basis of the drawings.

Figure 1:
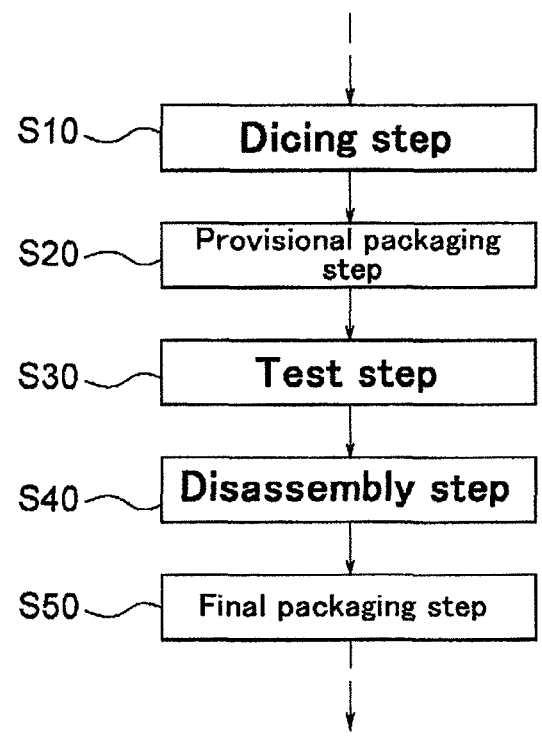
FIG. 1 is a flowchart which shows part of a device production process in an embodiment of the present invention.

FIG. 1 is a flowchart showing part of the device production process in the present embodiment.

In the present embodiment, after a semiconductor wafer is diced (after step S10 of FIG. 1) and before final packaging (before step S50), the electronic circuit devices formed into each die are tested (steps S20 to S40). At this time, in the present embodiment, first, the die 90 is temporarily mounted on a test carrier 60 (step S20). Next, the die 90 and a test apparatus (not shown) are electrically connected through this test carrier 60 so as to test the electronic circuit devices which are formed into the die 90 (step S30). Further, after this test ends, the die 90 is taken out from the test carrier 60 (step S40), then this die 90 is finally packaged whereby the device is completed as a final product (step S50).

First, the configuration of the test carrier 60 on which a die 90 is temporarily mounted (provisionally packaged) for the test in the present embodiment will be explained.

Figure 4:
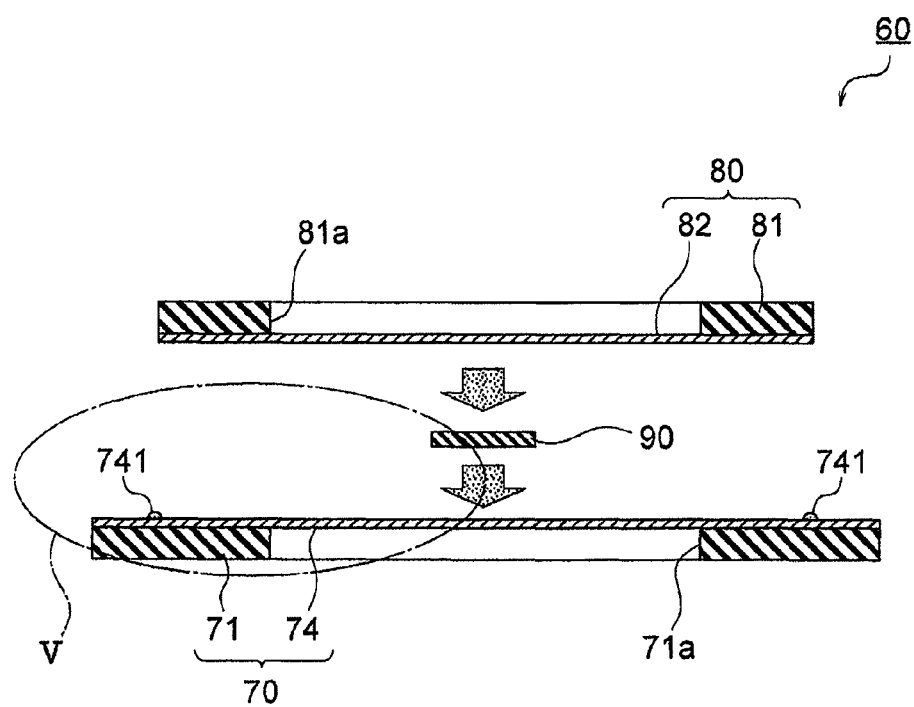
FIG. 4 is a disassembled cross-sectional view of a test carrier in an embodiment of the present invention.
Figure 5:
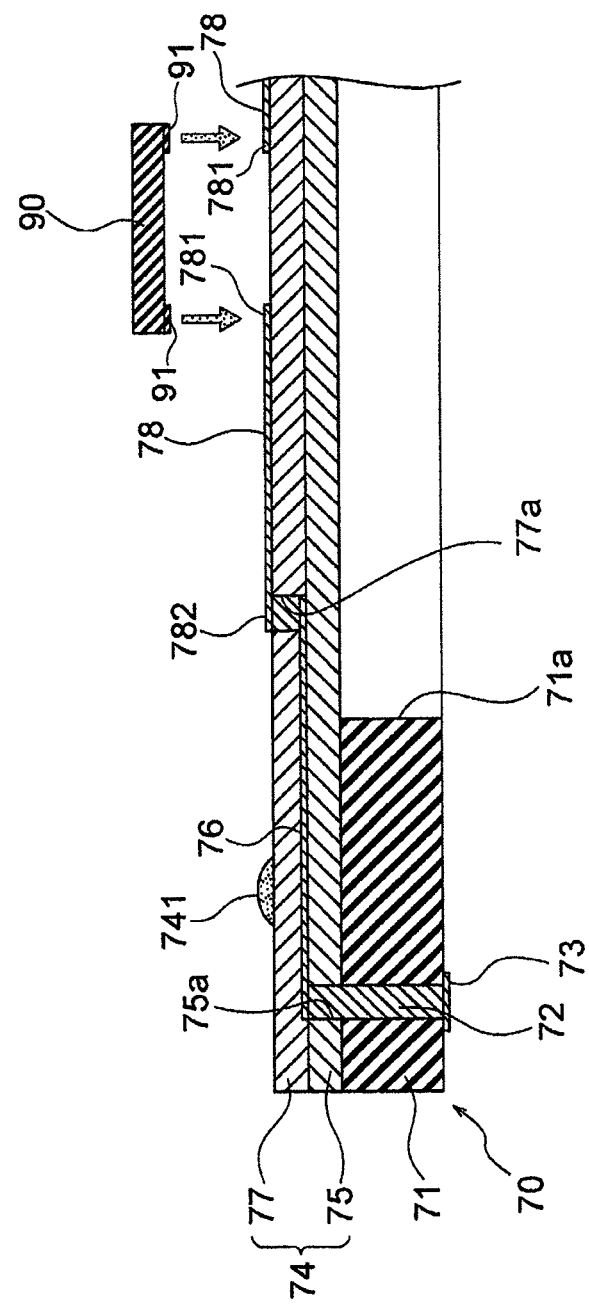
FIG. 5 is an enlarged view of a part V of FIG. 4.
Figure 6:
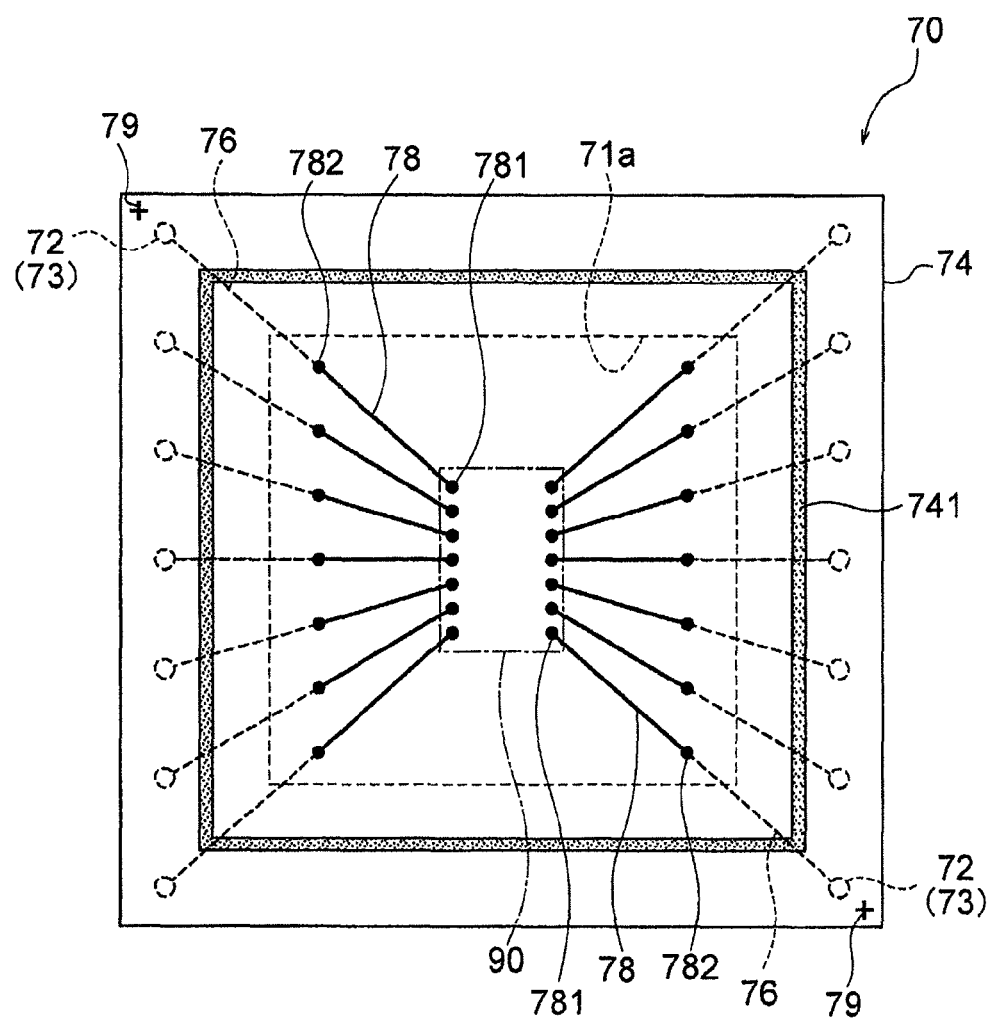
FIG. 6 is a plan view which shows a base member of a test carrier in an embodiment of the present invention.

FIG. 2 to FIG. 5 are views of a test carrier in the present embodiment, while FIG. 6 is a plan view of a base member of the test carrier.

Figure 2:
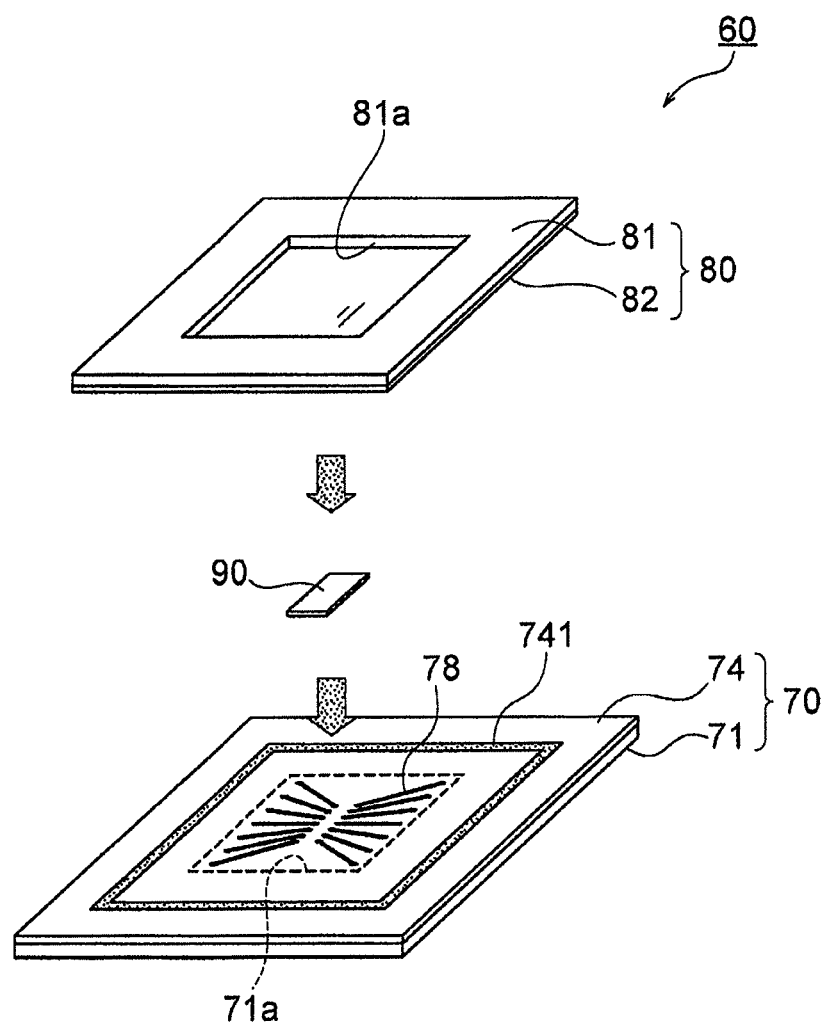
FIG. 2 is a disassembled perspective view of a test carrier in an embodiment of the present invention.
Figure 3:
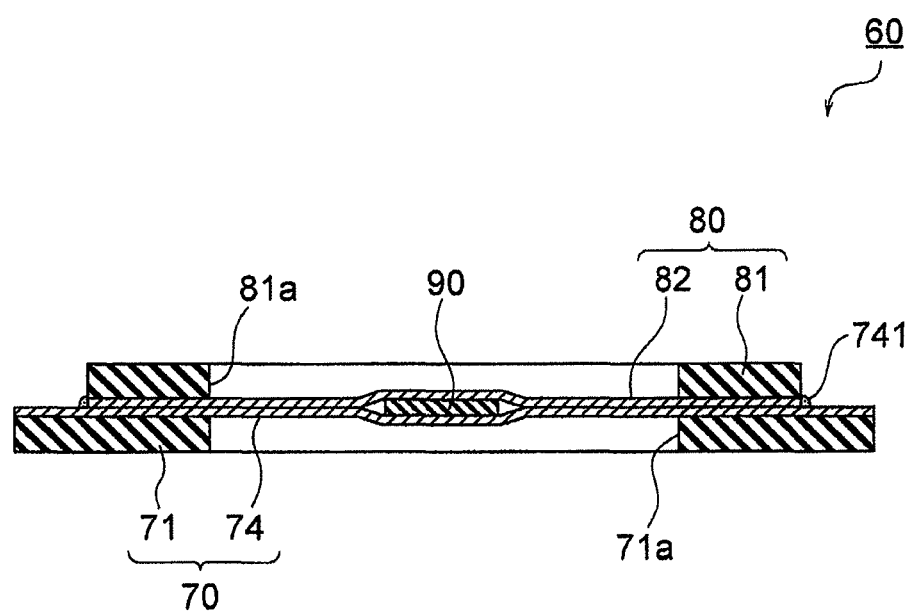
FIG. 3 is a cross-sectional view of a test carrier in an embodiment of the present invention.

The test carrier 60 in the present embodiment, as shown in FIG. 2 to FIG. 4, comprises: a base member 70 on which interconnect patterns 76 and 78 (see FIG. 5 and FIG. 6) are formed and to which a die 90 is mounted; and a cover member 80 which is placed over this base member 70. This test carrier 60 holds the die 90 by sandwiching the die 90 between the base member 70 and the cover member 80.

The base member 70 comprises: a rigid board 71 at the center of which an opening 71a is formed; and a flexible board 74 which is laminated over the entire surface of the rigid board 71 including the center opening 71a. This flexible board 74 is designed to be deformable at its center, while is designed not to be deformable by the rigid board 71 at its periphery, whereby the handling ability of the test carrier 60 is improved.

As an specific example of the rigid board 71, for example, a single layer board or a multilayer board made of a polyamide-imide resin, ceramic, glass, etc. may be mentioned. On the other hand, as a specific example of the flexible board 74, for example, a single layer board or a multilayer board made of a polyimide resin may be mentioned.

The flexible board 74, as shown in FIG. 5, has: a base film 75 on which second interconnect patterns 76 are formed; and a coverlay 77 covering this base film 75.

The second interconnect patterns 76 which are shown in FIG. 5 and FIG. 6 are, for example, formed in advance by etching a copper foil which is laminated on the base film 75. On the other hand, first interconnect patterns 78 is formed on the surface of the coverlay 77 by ink jet printing. The first interconnect patterns 78 are printed in real time, right before mounting the die 90 on the base member 70, by an interconnect forming module 12 of the carrier assembly apparatus 1 explained later.

One end of each first interconnect pattern 78 is connected to one end of a second interconnect pattern 76 through a through hole 77a which is formed in the coverlay 77. On the other hand, a pad 781 to which an input/output terminal 91 of the die 90 is connected is formed at the other end of the first interconnect pattern 78. Note that, the other end of the first interconnect pattern 78 is equivalent to a printing start position 782 of the later explained interconnect forming module 12.

A through hole 72 penetrates a position of the rigid board 71 corresponding to the other end of each second interconnect pattern 76. The second interconnect pattern 76 is connected to the through hole 72 through the through hole 75a which is formed in the base film 75. This through hole 72 is connected to a connection terminal 73 which is formed on the bottom surface of the rigid board 71. When the electronic circuit device which is formed into the die 80 is tested, a contactor of the test apparatus contacts with this connection terminal 73.

Note that, the other end of each second interconnect pattern 76 may be positioned at the inside of the center opening 71a of the rigid board 71 so as to form the connection terminal 73 on the back surface of the flexible board 74. Further, the other end of the second interconnect pattern 76 is exposed at the top side so as to form the connection terminal 73 on the top surface of the flexible board 74.

As shown in FIG. 6, alignment marks 79, which are used for determination of the printing start positions 782 of the first interconnect patterns 78, are formed at the two corners positioned on a diagonal of the surface of the coverlay 77. Note that, so long as the alignment marks are formed at two or more locations on the surface of the coverlay, the number and positions of the alignment marks are not particularly limited. Further, in the present embodiment, the alignment marks 79 are cross shapes, but they are not particularly limited to these shapes.

Returning to FIG. 2 to FIG. 4, the cover member 80 comprises: a rigid board 81 at the center of which an opening 81a is formed; and a film 82 which is laminated on that rigid board 81. The film 82 is designed to be deformable at its center part, while is designed to be deformable at its periphery by the rigid board 81.

As a specific example of the rigid board 81, for example, a board member made of a polyamide-imide resin, ceramic, glass, etc. may be mentioned. On the other hand, as a specific example of the film 82, for example, a sheet shaped member made of a polyimide resin may be mentioned.

Note that, it is also possible to configure the cover member 80 by just the film 82 or possible to configure the cover member 80 by only a rigid board 81 with no opening 81a. Further, in the present embodiment, any interconnect patterns are not formed on the cover member 80, but the invention is not particularly limited to this. Instead of the base member 70 or in addition to the base member 70, interconnect patterns may be formed on the cover member 80. In this case, instead of the rigid board 81, a board similar to the above-mentioned rigid board 71, for example, a single layer board or multilayer board made of a polyamide-imide resin or ceramic, glass, etc. may be used. Further, instead of the film 82, a board similar to the above-mentioned flexible board 74, for example, a single layer board or a multilayer board made of a polyimide resin may be used. Furthermore, when the cover member 80 has a rigid board and a flexible board, the base member 70 may also be configured by just a film.

The above explained test carrier 60 is assembled as follows. That is, a die 90 is placed on the base member 70 in the state where the input/output terminals 91 are aligned with the pads 781, then the cover member 80 is placed on the base member 70 under a reduced pressure. Next, the pressure is returned to atmospheric pressure in the state where the die 80 is sandwiched between the base member 70 and the cover member 80, whereby the die 80 is held between the base member 70 and the cover member 80.

Note that, the input/output terminals 91 of the die 90 and the pads 781 of the flexible board 74 are not fastened by solder etc. In the present embodiment, the space between the base member 70 and the cover member 80 becomes a negative pressure compared with atmospheric pressure, so the flexible board 74 and the film 82 press the die 90 so as to contact the input/output terminals 91 of the die 90 and the pads 781 of the flexible board 74 each other.

Incidentally, when the die 90 is relatively thick, reverse from the constitution shown in FIG. 3, the base member 70 and the cover member 80 may be stacked so that the rigid board 71 and the rigid board 81 directly contact each other.

As shown in FIG. 2 to FIG. 6, the base member 70 and the cover member 80 are fastened to each other by the bonding part 741 in order to prevent from offset and improve in sealability. As the adhesive forming this bonding part 741, for example, an ultraviolet curing type adhesive may be illustrated. The adhesive is in advance applied to the base member 70 at positions facing the periphery of the cover member 80. The adhesive is cured by ultraviolet irradiation after the base member 70 is covered with the cover member 80, whereby the bonding part 741 is formed.

Next, the carrier assembly apparatus 1 which is used in the provisional packaging step (FIG. 1, step S20) will be explained. Note that, the carrier assembly apparatus which is explained below is just one example. The carrier assembly apparatus in the present invention is not limited to this.

Figure 7:
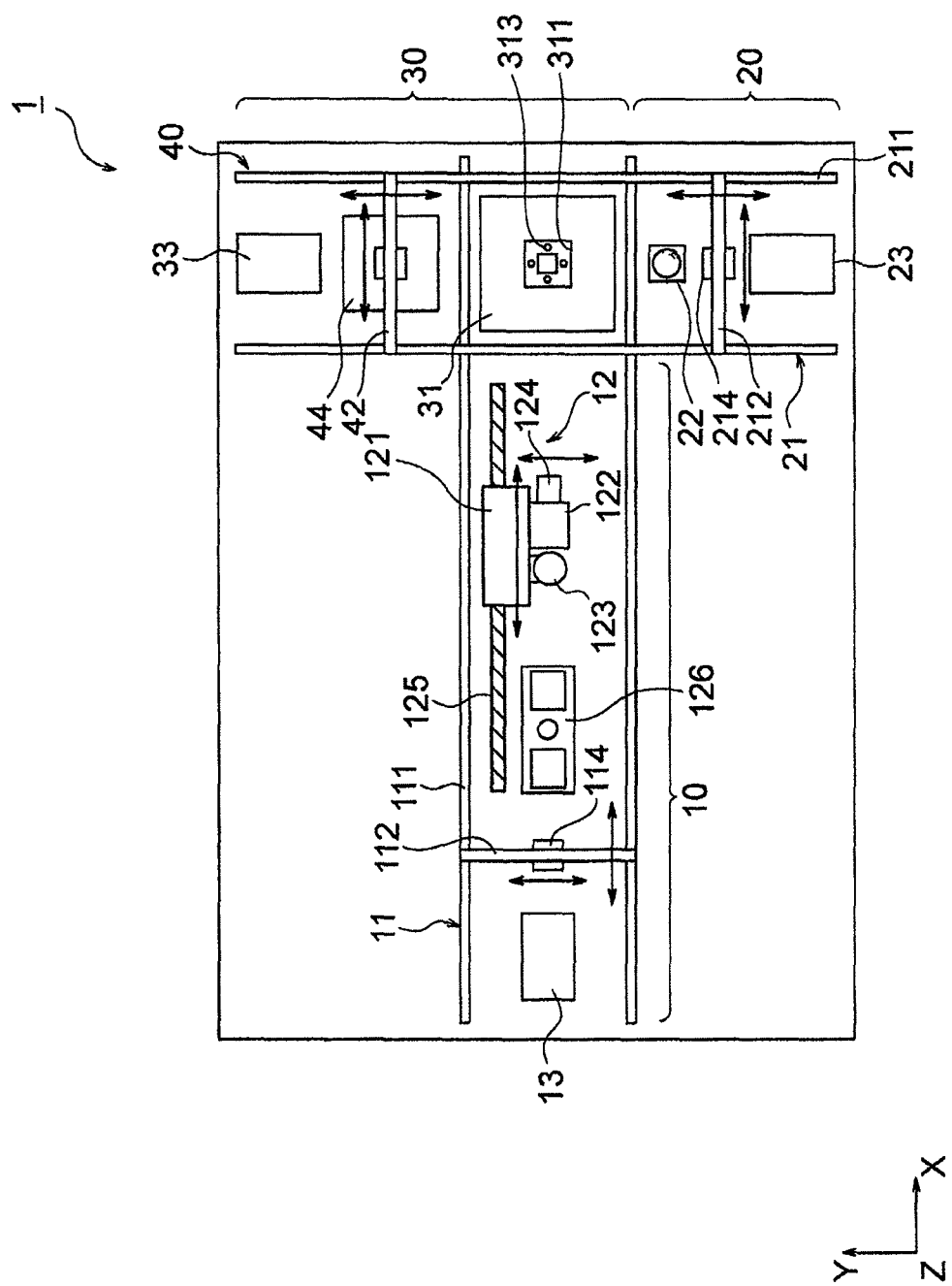
FIG. 7 is a plan view which shows the overall configuration of a carrier assembly apparatus in an embodiment of the present invention.
Figure 8:
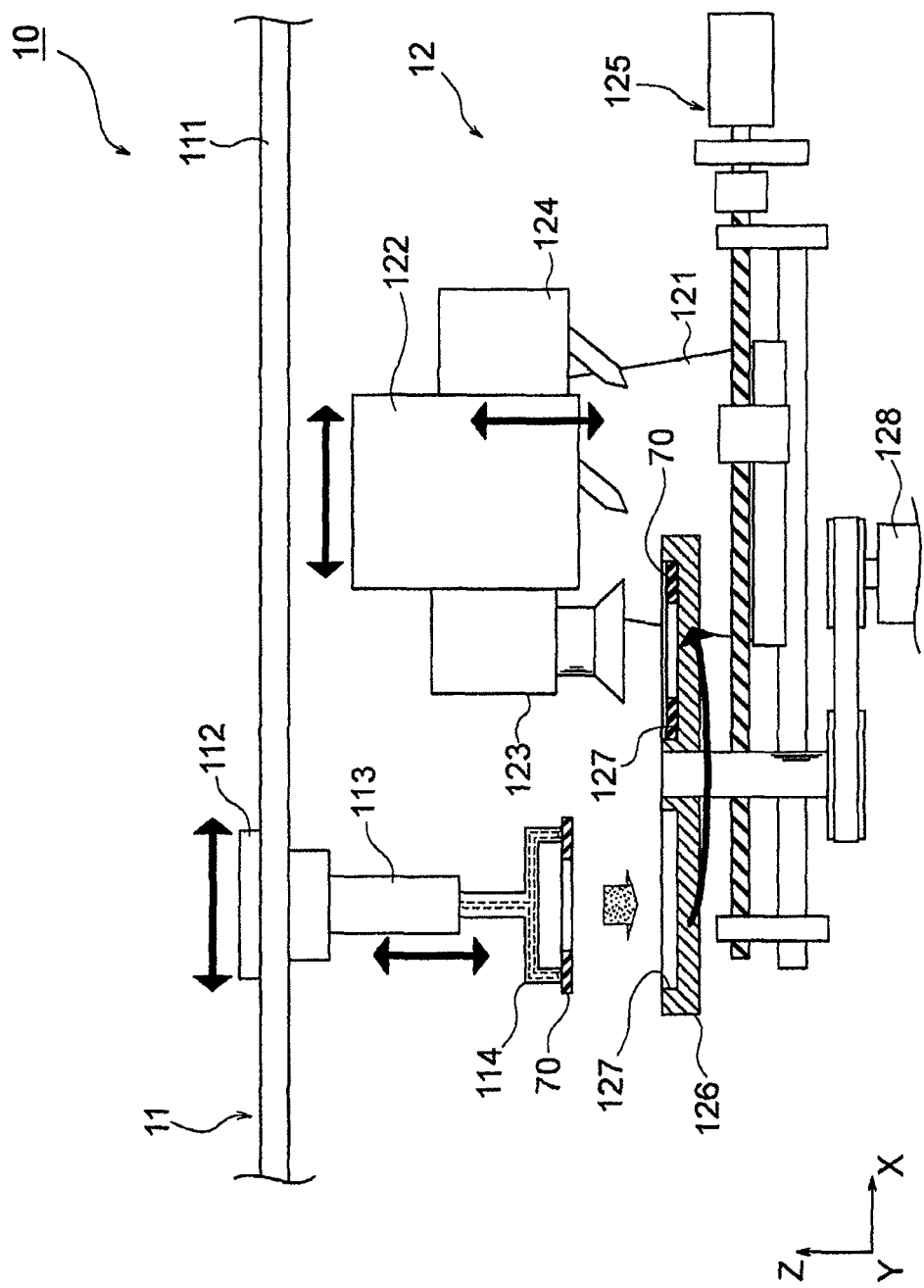
FIG. 8 is a side view which shows a base feed unit of a carrier assembly apparatus of FIG. 7.
Figure 9:
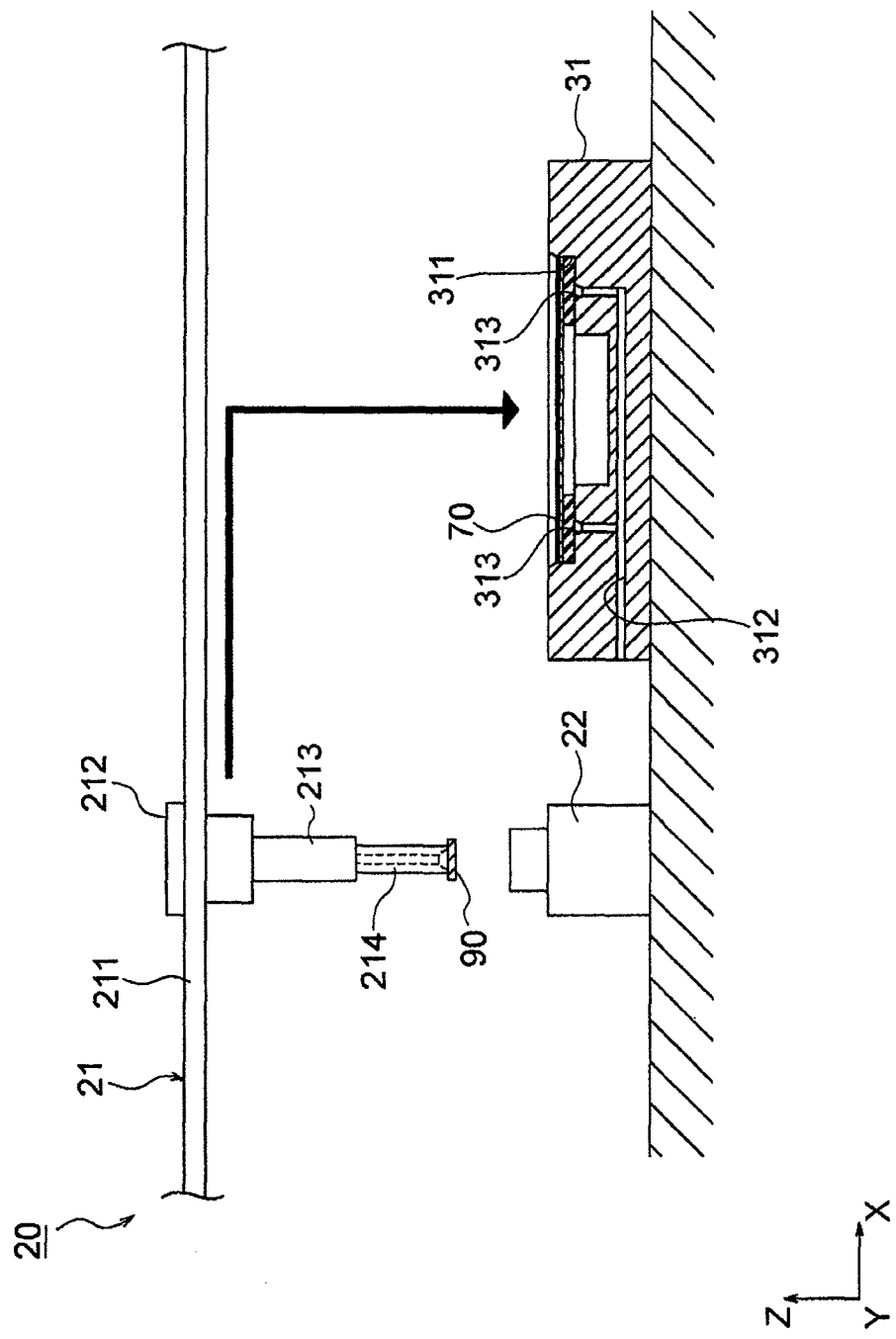
FIG. 9 is a side view which shows a die feed unit of the carrier assembly apparatus of FIG. 7.
Figure 10:
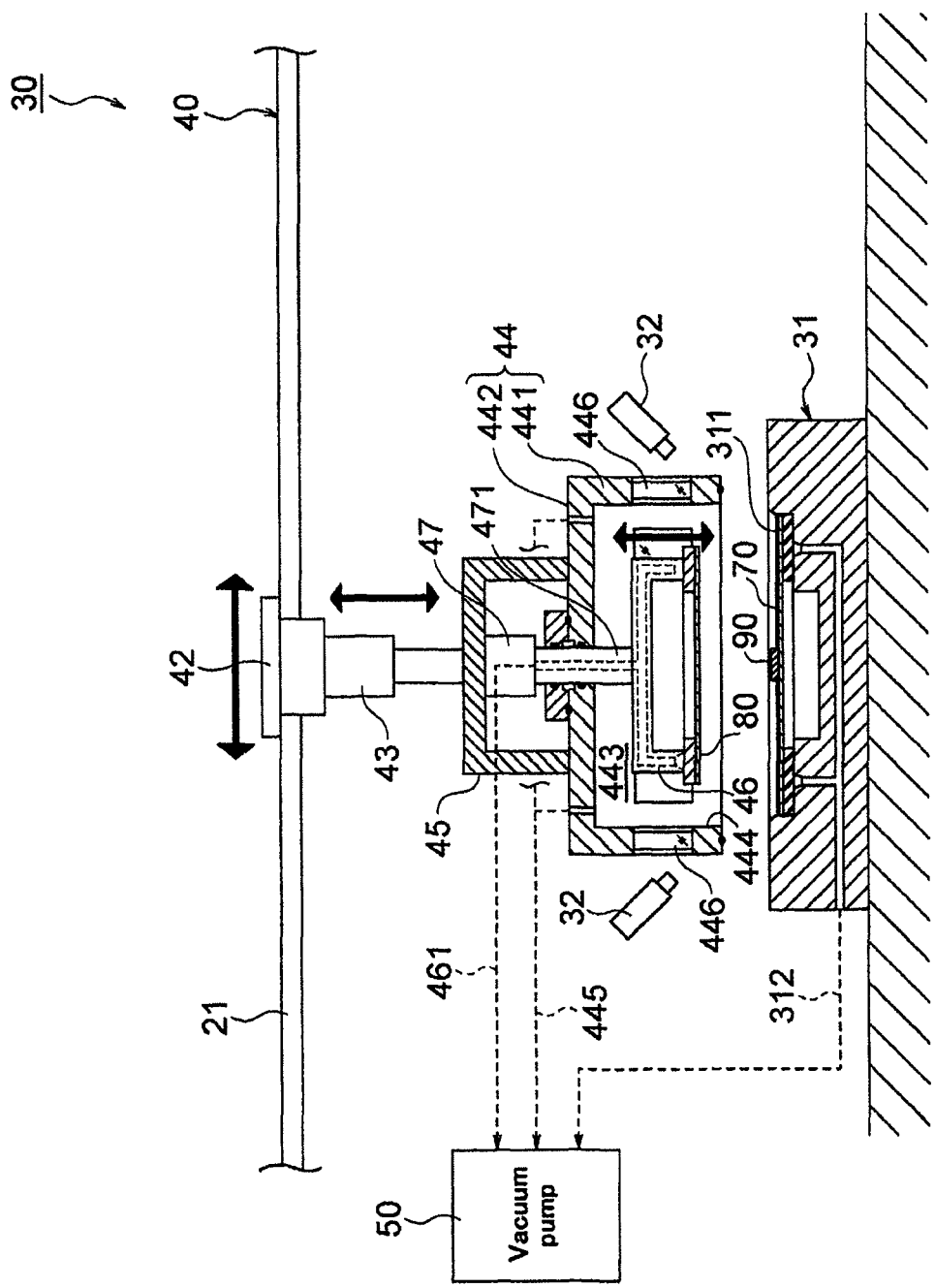
FIG. 10 is a cross-sectional view which shows an assembly unit of the carrier assembly apparatus of FIG. 7.

FIG. 7 is a plan view showing the overall configuration of a carrier assembly apparatus in the present embodiment, FIG. 8 is a side view which shows a base feed unit of a carrier assembly apparatus, FIG. 9 is a side view which shows a die feed unit of a carrier assembly apparatus, and FIG. 10 is a cross-sectional view which shows an assembly unit of a carrier assembly apparatus.

The carrier assembly apparatus 1 in the present embodiment is an apparatus for temporarily mounting a die 80 to the test carrier 60 in order to test the electrical circuit devices formed into the die 90.

This carrier assembly apparatus 1, as shown in FIG. 7, comprises: a base feed unit 10 which forms the first interconnection patterns 78 on the base member 70 and then feeds the base member 70 to the assembly unit 30; a die feed unit 20 which detects the positions of the input/output terminals 91 of a die 90 and then feeds the die 90 to the assembly unit 30; and an assembly unit 30 which assembles the base member 70, die 90, and cover member 80.

The base feed unit 10, as shown in FIG. 7 and FIG. 8, comprises: a first conveyor arm 11 which conveys a base member 70; and an interconnect forming module 12 which prints first interconnect patterns 78 on the surface of the base member 70.

The first conveyor arm 11 has: an X-direction rail 111 which is provided along the X-direction; a Y-direction rail 112 which can move over this X-direction rail 111 along the X-direction; a Z-direction actuator 113 which can move over this Y-direction rail 112 along the Y-direction; and a suction head 114 which is provided at the front end of the Z-direction actuator 113 and holds the base member 70 by suction. The first conveyor arm 11 is designed to be able to move a base member 70 in three dimensions. This first conveyor arm 11 conveys a base member 70 from a first stocker 13, in which a large number of the base members 70 are stocked, to a rotary stage 126 and conveys a printed base member 70 from the rotary stage 126 to the assembly table 31 of the assembly unit 30.

The interconnect forming module 12 comprises: a movable unit 121 which has a printing head 122, a first camera 123, and a dispenser 124; a movement mechanism 125 which moves the movable unit 121; and a rotary stage 126 which holds a base member 70 on which the first interconnect patterns 78 are to be printed.

The movable unit 121 is provided with a printing head 122 which forms first interconnect patterns 78 on the base member 70 by ink jet printing. Note that, instead of ink jet printing, the printing head 122 may use laser printing or another method for forming interconnect patterns in real time so as to form the first interconnect patterns 78 on the base member 70.

Further, this movable unit 121 is provided with a first camera 123 which captures an image of a base member 70 and a dispenser 124 in which an adhesive is filled. The not particularly shown image processing apparatus detects the positions of the alignment marks 79 from the image which this first camera 123 captures and uses the detection result to determine the printing start positions 782 of the first interconnect patterns 78. Further, the dispenser 124 applies the adhesive being to form the bonding part 741 to the base member 70 after the printing head 122 forms the interconnect patterns.

The movement mechanism 125 has for example ball-and-screw mechanisms and is designed to be able to move the movable unit 121 in three dimensions. Note that, FIG. 7 and FIG. 8 only show the ball-and-screw mechanism of one direction, but in actuality a ball-and-screw mechanism along the X-direction and a ball-and-screw along the Y-direction are provided and an elevator mechanism for moving the movable unit 121 up and down is also provided The rotary stage 126 has two recess-shaped holding parts 127 which are able to hold base members 70 and is designed to be able to be rotated by a drive force which is transmitted from the motor 128. For this reason, while the first conveyor arm 11 feeds a base member 70 to one holding part 127, the printing head 122 can be forming first interconnect patterns 78 on the base member 70 or the dispenser 124 can be applying an adhesive to the base member 70 in the other holding part 127.

The base member 70 on which the first interconnect patterns 78 is formed by the above interconnect forming module 12 is conveyed by the first conveyor arm 11 from the rotary stage 126 to the assembly table 31 of the assembly unit 30.

The die feed unit 20, as shown in FIG. 7 and FIG. 9, comprises: a second conveyor arm 21 which conveys a die 90; and a second camera 22 which captures the image of the die 90.

The second conveyor arm 21 has: a Y-direction rail 211 which is provided along the Y-direction; an X-direction rail 212 which can move over this Y-direction rail 211 along the Y-direction; a Z-direction actuator 213 which can move over the X-direction rail 212 along the X-direction; and a suction head 213 which is provided at the front end of the Z-direction actuator 213 and which holds the die 90 by suction. The second conveyor arm 21 is designed to be able to move the die 90 in three dimensions. This second conveyor arm 21 conveys a die 90 from a second stocker 23, in which a large number of dies 90 are stocked, to the assembly table 31 of the assembly unit 30.

The second camera 22 captures an image of the die 90, which is held by the second conveyor arm 21, from the bottom. The not particularly shown image processing apparatus detects the positions of the input/output terminals 91 of the die 90 from the image which is captured by this second camera 22 and uses the detection results to determine the pad forming positions 781.

The assembly unit 30, as shown in FIG. 7 and FIG. 10, comprises an assembly table 31 to which a base member 70 and a die 90 are fed from the base feed unit 10 and die feed unit 20; an assembly arm 40 which conveys a cover member 80 to the assembly stage 31 so as to assemble the test carrier 60; and emission devices 33 which emits ultraviolet to the bonding part 741 of the test carrier 60.

Explaining the assembly table 31 while referring to FIG. 9, a recess part 311 able to hold a base member 70 is formed at the center part of the assembly table 31. Suction holes 313, which communicates with a vacuum pump 50 through a first suction line 312 (see FIG. 10), open at the periphery of this recess part 311. A base member 70 is placed on this recess part 311 by the first conveyor arm 11. Further, the vacuum pump 50 applies suction to the base member 70 placed on the assembly table 31 through the first suction line 312 and suction holes 313, whereby the base member 70 can be fastened to the assembly table 31. Furthermore, a die 90 is placed on this base member 70 by the second conveyor arm 21.

The assembly arm 40, as shown in FIG. 7 and FIG. 10, has: an X-direction rail 42 which is able to move over the Y-direction rail 21 along the Y-direction; and a first elevating actuator 43 which is able to move over the X-direction rail 42 along the X-direction. The first elevating actuator 43 is designed to be able to simultaneously move the pressure reduction head 44 and a holding head 46 up and down, the pressure reduction head 44 has a pressure reduction chamber 443 and a holding head 46 holds the cover member 80. This assembly arm 40 conveys a cover member 80 from a third stocker 33, in which a large number of cover members 80 are stocked, to the assembly table 31 and stacks the cover member 80 on the base member 70 under reduced pressure so as to assemble the test carrier 60.

The pressure reduction head 44, as shown in FIG. 10, comprises a square-tube shaped tubular part 441 and a lid part 442 which shuts the top end of the tubular part. This tubular part 441 and lid part 442 define the pressure reduction chamber 443. This pressure reduction chamber 443 does not have a bottom floor, but has an opening part 444 at the bottom side.

Further, a seal member is attached across the entire circumference of the bottom end of the tubular part 441 of the pressure reduction head 44. By making the pressure reduction head 44 abut against the assembly table 31, the pressure reduction chamber 443 becomes a sealed space. This pressure reduction chamber 443 is connected to the vacuum pump 50 through a second suction line 445. For this reason, when the vacuum pump 50 operates in the state with bringing the pressure reduction head 44 into close contact with the assembly table 31, it becomes possible to reduce the pressure in the pressure reduction chamber 443.

Further, a fastening member 45 is attached to the lid part 442 of this pressure reduction head 44. A second actuator 47, which moves the holding head 46 up and down with respect to the pressure reduction head 44, is fastened to this fastening member 45. That is, the second elevating actuator 47 is indirectly fastened through the fastening member 45 to the pressure reduction head 44 and is provided above the pressure reduction head 44. Note that, the second elevating actuator 47 may be directly fastened to the pressure reduction head 44. Furthermore, the first elevating actuator 43 of the assembly arm 40 is coupled to the top part of this fastening member 45. As the first and second elevating actuators 43 and 47, for example, ball-and-screw mechanisms with air cylinders or motors etc. may be illustrated.

The holding head 46 is connected to the vacuum pump 50 through a third suction line 461 and is designed to be able to hold a cover member 80 by suction. This holding head 46 is fastened to a front end of a drive shaft 471 of the second elevating actuator 47 and is housed inside the pressure reduction chamber 443 of the pressure reduction head 44. For this reason, a drive shaft 471 of the second elevating actuator 47 passes through the lid part 442 of the pressure reduction head 44. Note that, an O-ring or oil seal or other seal member is arranged at the part of the lid part 442 through which the drive shaft 471 passes, whereby sufficient air-tightness is secured.

Furthermore, the four surfaces of the tubular part 441 of the pressure reduction head 44 are formed with windows 446 through which ultraviolet is able to pass. Emission devices 32 are arranged near the windows 446. In the present embodiment, by forming the windows 446 in the tubular part 441, the adhesive can be cured by the emission devices 32 which are arranged outside of the pressure reduction chamber 443.

Figure 11:
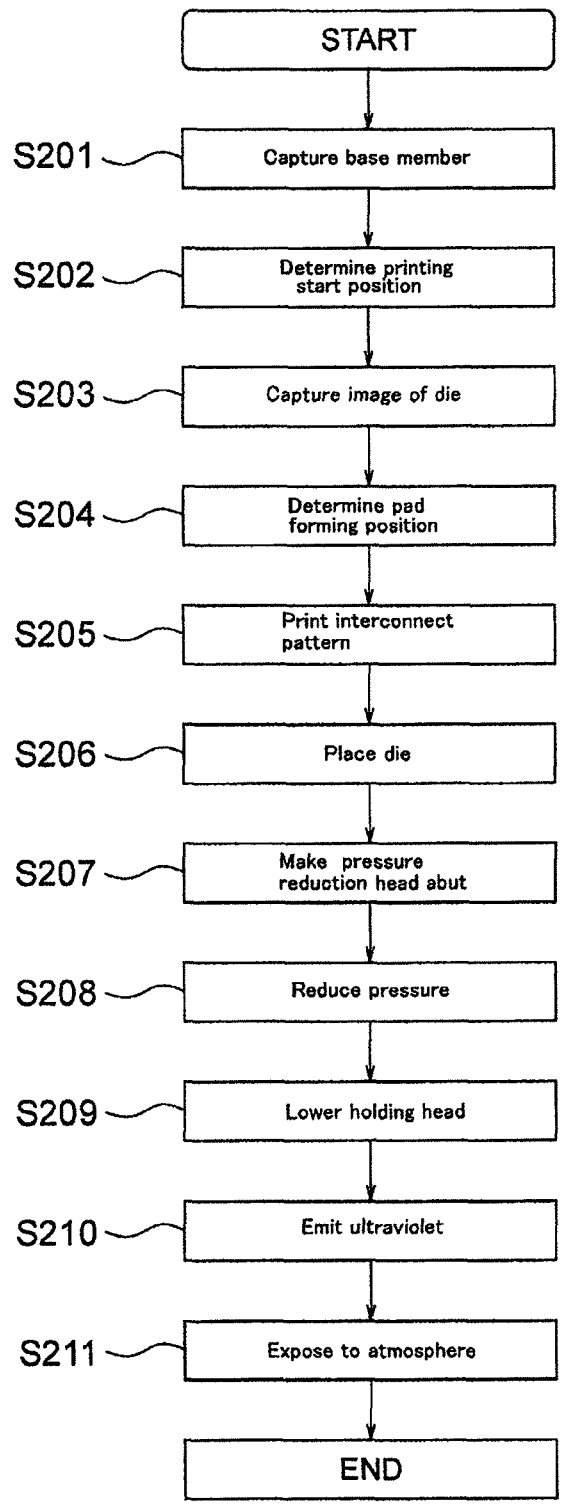
FIG. 11 is a flowchart which shows an assembly method of a test carrier in an embodiment of the present invention.
Figure 12:
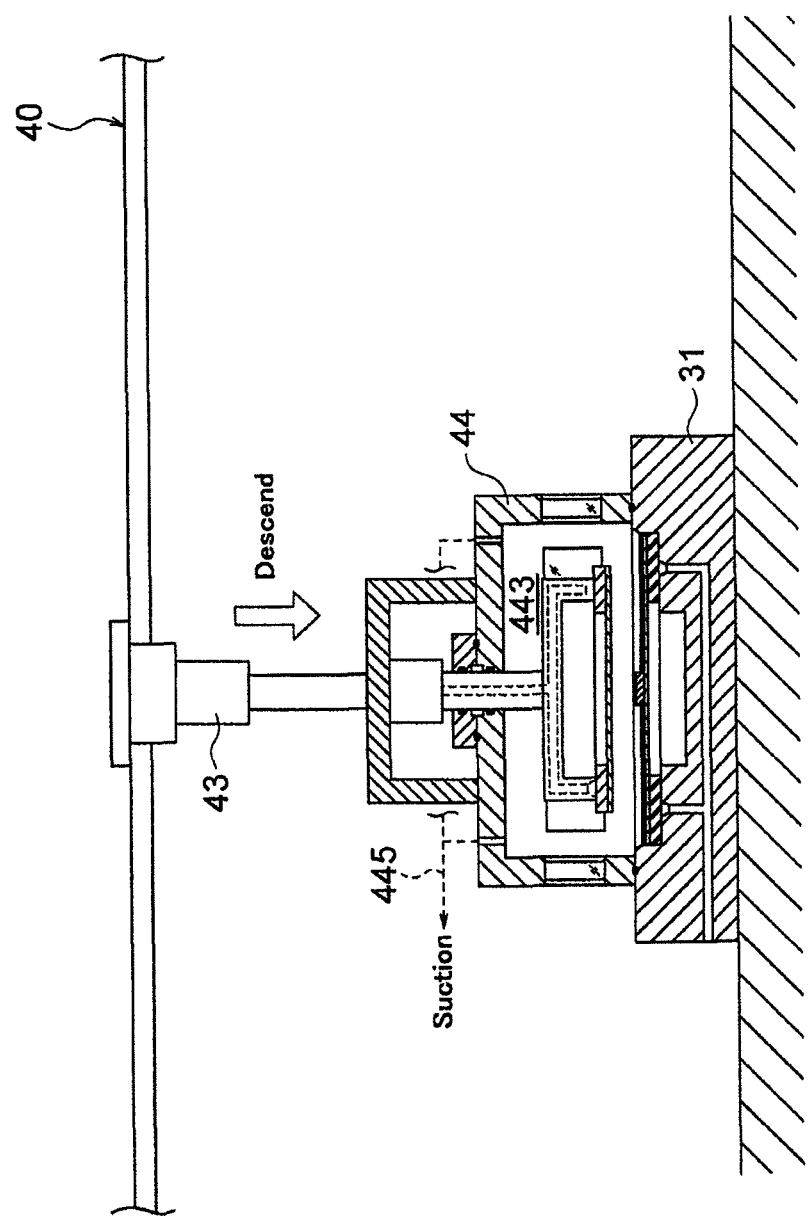
FIG. 12 is a view which shows the operation of an assembly unit in an embodiment of the present invention and is a view which shows the state where the holding head and the pressure reduction head simultaneously descend.
Figure 13:
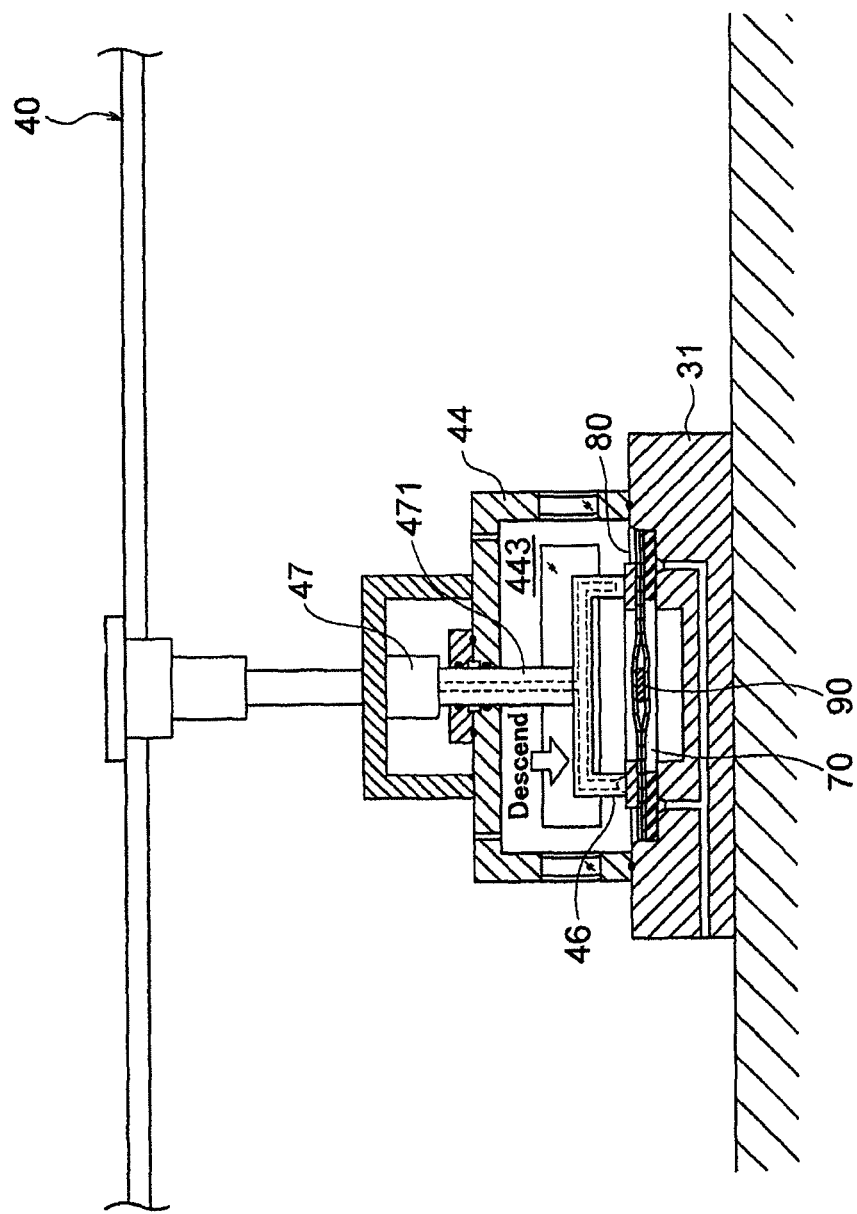
FIG. 13 is a view which shows the operation of the assembly unit in an embodiment of the present invention and shows the state where the holding head is descending relative to the pressure reduction head.
Figure 14:
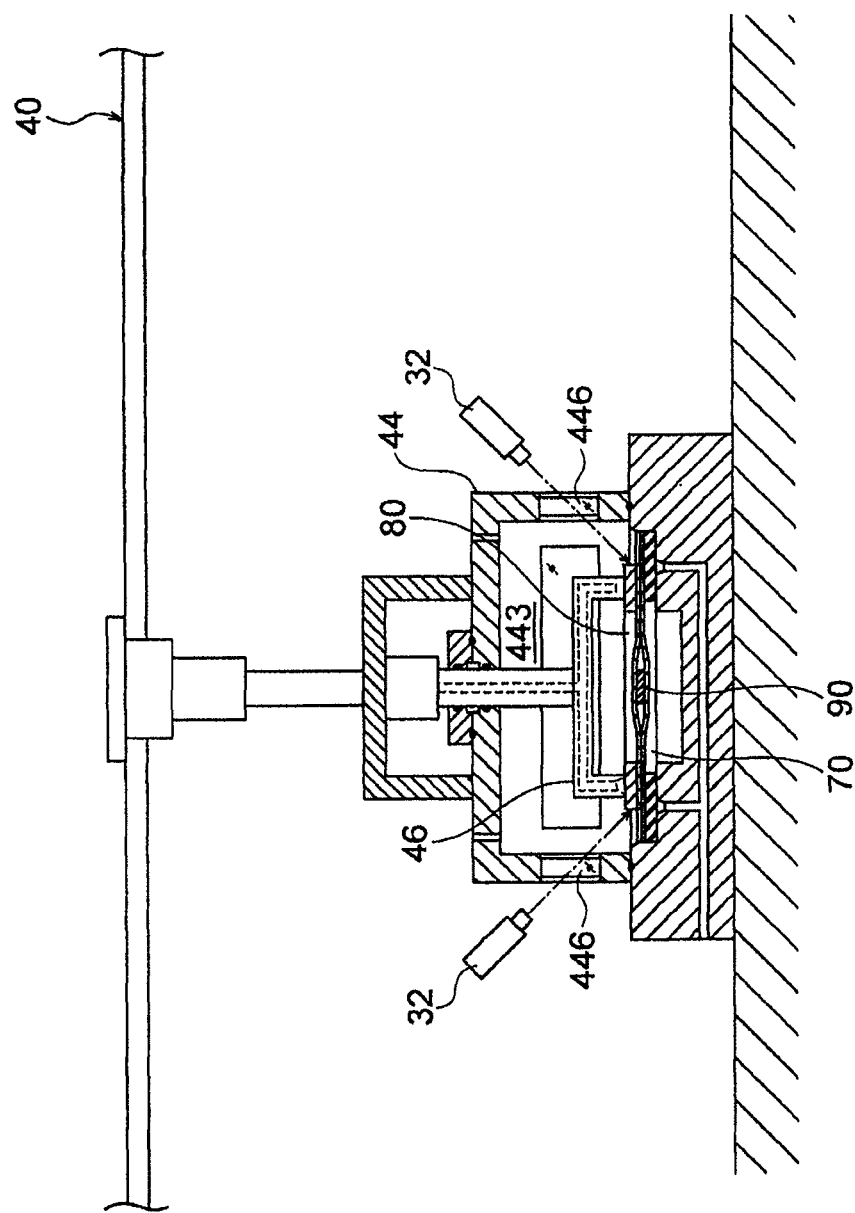
FIG. 14 is a view showing the operation of the assembly unit in an embodiment of the present invention and shows the state where an emission device emits ultraviolet toward an adhesive.

Next, the assembly method of a test carrier 60 in the present embodiment will be explained with reference to FIG. 11 to FIG. 14. FIG. 11 is a flowchart showing an assembly method of a test carrier in the present embodiment, while FIG. 12 to FIG. 14 are cross-sectional views showing the operation of the assembly unit in the present embodiment.

As shown in FIG. 11, first, the first conveyor arm 11 conveys a base member 70 from the first stocker 13 to the rotary stage 126 and the first camera 123 captures an image of the base member 70 (step S201). The image processing apparatus detects the positions of the alignment marks 79 from the image and determines the printing start positions 782 of the first interconnect patterns 78 on the basis of the detection result (step S202).

On the other hand, the second conveyor arm 21 conveys a die 90 from the second stocker 23 to above the second camera 22 and the second camera 22 captures an image of the die 90 (step S203). The image processing apparatus detects the input/output terminals 91 of the die 90 from the image and determines the pad forming positions 791 of the first interconnect patterns 78 on the basis of the detection results (step S204).

Next, the interconnect forming module 12 forms the first interconnect patterns 78 by ink jet printing between the printing start positions 782 and the pad forming positions 781 (step S205).

Next, the first conveyor arm 11 conveys the base member 70 from the rotary stage 126 to the assembly table 31 and the second conveyor arm 21 places the die 90 on the base member 70 (step S206).

Next, the assembly arm 40 moves the pressure reduction head 44 to above the assembly table 31 and the first elevating actuator 43 moves the pressure reduction head 44 downwards. Further, as shown in FIG. 12, when the pressure reduction head 44 abuts against the assembly table 31, the pressure reduction chamber 443 of the pressure reduction head 44 forms a sealed space (step S207). In this state, the vacuum pump 50 evacuates the inside of the pressure reduction chamber 443 through the second suction line 445, so the inside of the pressure reduction chamber 443 is reduced in pressure compared with the atmospheric pressure (S208).

Under this reduced pressure, as shown in FIG. 13, the second elevating actuator 47 moves the holding head 46 relatively downwards with respect to the pressure reduction head 44 so as to stack the cover member 80 on the base member 70 (step S209). Next, as shown in FIG. 14, ultraviolet is emitted through the windows 446 of the pressure reduction head 44 from the emission devices 32 toward the adhesive so as to cure the adhesive and form the bonding part 741 (step S210).

Next, the reduction in pressure of the pressure reduction chamber 443 through the second suction line 445 is stopped, the first elevating actuator 43 moves the pressure reduction head 44 and the holding head 46 upwards, and the pressure reduction space 443 is exposed to the atmosphere (step S211). Due to this exposure, the space between the base member 70 and the cover member 80 becomes a negative pressure compared with the atmospheric pressure, so the input/output terminals 91 of the die 90 and the pads 781 of the flexible board 74, which are not fastened by solder etc., are reliably brought into contact.

As explained above, in the present embodiment, it is possible that the assembly arm 40 moves the holding head 46 and the pressure reduction head 44 and makes them abut against the assembly table 31 and then the second elevating actuator 47 moves only the holding head 46 and stacks the cover member 80 on the base member 70. For this reason, the vacuum furnace becomes unnecessary, and the conveyance systems, which are interrupted in the vacuum furnace, can be made integrated, so the structure of the carrier assembly apparatus 1 can be streamlined and the size and cost of the carrier assembly apparatus 1 can be reduced. Further, continuous conveyance becomes possible, so the assembly time can be shortened.

Note that, the above explained embodiments were described to facilitate understanding of the present invention and were not described for limiting the present invention. Therefore, the elements disclosed in the above embodiments include all design changes and equivalents falling under the technical scope of the present invention.

REFERENCE SIGNS LIST

1 . . . carrier assembly apparatus
10 . . . base feed unit
11 . . . first conveyor arm (third moving means)
12 . . . interconnect forming module
122 . . . printing head (interconnect forming means)
124 . . . dispenser
20 . . . die feed unit
21 . . . second conveyor arm (fourth moving means)
30 . . . assembly unit
31 . . . assembly table
313 . . . suction holes
32 . . . emission device
40 . . . assembly arm
43 . . . first elevating actuator (first moving means)
44 . . . pressure reduction head
441 . . . tubular part
442 . . . lid part
443 . . . pressure reduction chamber
444 . . . opening part
445 . . . second suction line
446 . . . window
45 . . . fastening member
46 . . . holding head
461 . . . third pickup line
47 . . . second elevating actuator (second moving means)
471 . . . drive shaft
50 . . . vacuum pump (pressure reducing means)
60 . . . test carrier
70 . . . base member
71 . . . rigid board
74 . . . flexible board
80 . . . cover member
81 . . . rigid board
82 . . . film
90 . . . die (electronic device)

The invention claimed is:

1. A carrier assembly apparatus which assembles a test carrier having a base member and a cover member between which an electronic device is sandwiched, the carrier assembly apparatus comprising:
an assembly table which supports the base member on which the electronic device is placed;
a holding head which holds the cover member;
a pressure reduction head which has a pressure reduction chamber accommodating the cover member and having an opening part and which abuts against the assembly table so as to form a sealed space;
a first moving device configured to simultaneously move the holding head and the pressure reduction head to the assembly table; and
a second moving device configured to move the holding head relative to the pressure reduction head.

2. The carrier assembly apparatus as set forth in claim 1, wherein the pressure reduction head has:
a tubular part which is able to accommodate the cover member; and
a lid part which shuts one end of the tubular part.

3. The carrier assembly apparatus as set forth in claim 2, wherein
the second moving device has a shaft which is connected to the holding head, and
the shaft passes through the lid part so that the holding head is positioned inside the tubular part.

4. The carrier assembly apparatus as set forth in claim 1, wherein the assembly table has suction holes which hold the base member by suction.

5. The carrier assembly apparatus as set forth in claim 1, comprising:
an emitting device configured to emit ultraviolet rays toward a bonding part which bonds the base member and the cover member, wherein the pressure reduction head has a window through which ultraviolet rays which are emitted from the emitting device toward the bonding part passes.

6. The carrier assembly apparatus as set forth in claim 1, further comprising: a pressure reducing device which is connected to the pressure reduction chamber and reduces the pressure of the sealed space which is formed by the assembly table and the pressure reduction head.

7. The carrier assembly apparatus as set forth in claim 1, further comprising: a third moving device configured to move the base member to the assembly table; and a fourth moving device configured to place the electronic device on the base member which is supported on the assembly table.

8. The carrier assembly apparatus as set forth in claim 1, further comprising: an interconnect forming device configured to form interconnect patterns on the base member.

9. The carrier assembly apparatus as set forth in claim 1, wherein at least one of the base member or the cover member has a thin layer.

10. The carrier assembly apparatus as set forth in claim 1, wherein the electronic device is a die which is formed by dicing a semiconductor wafer.

* * * * *